(12) United States Patent
Nakamura et al.

(10) Patent No.: US 6,316,116 B1
(45) Date of Patent: Nov. 13, 2001

(54) CERAMIC CIRCUIT BOARD AND METHOD OF MANUFACTURING THE SAME

(75) Inventors: Miho Nakamura; Hideki Sato; Keiichi Yano; Nobuyuki Mizunoya, all of Yokohama; Tadashi Ishii, Yokosuka; Seiko Nagano, Kawasaki, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/548,276

(22) Filed: Apr. 12, 2000

(30) Foreign Application Priority Data

Apr. 30, 1999 (JP) .................................................. 11-124900
Sep. 29, 1999 (JP) .................................................. 11-277523

(51) Int. Cl.⁷ .............................. B32B 15/04; C04B 33/00
(52) U.S. Cl. ........................... 428/469; 428/213; 428/337; 428/698; 156/89.12; 156/89.15; 156/89.19; 156/89.21
(58) Field of Search ...................................... 428/469, 472, 428/472.2, 698, 212, 213, 323, 325, 337; 501/98.4, 152; 156/89.11, 89.12, 89.15, 89.19, 89.21

(56) References Cited

U.S. PATENT DOCUMENTS

| | | | |
|---|---|---|---|
| 4,883,704 | * | 11/1989 | Sato et al. .............................. 428/209 |
| 5,077,244 | * | 12/1991 | Iyori et al. .............................. 501/96 |
| 5,229,549 | * | 7/1993 | Yamakawa et al. .................. 174/262 |
| 5,439,856 | * | 8/1995 | Komatsu et al. ...................... 501/97 |
| 5,529,852 | * | 6/1996 | Sasame et al. ....................... 428/620 |
| 5,756,408 | * | 5/1998 | Terashi et al. ........................... 501/8 |

FOREIGN PATENT DOCUMENTS

| | | |
|---|---|---|
| 5-183069 | 7/1993 | (JP) . |
| 5-190703 | 7/1993 | (JP) . |
| 405183069A | * 7/1993 | (JP) . |
| 405238830A | * 9/1993 | (JP) . |
| 7-187789 | 7/1995 | (JP) . |

* cited by examiner

*Primary Examiner*—Blaine Copenheaver
*Assistant Examiner*—Stephen Stein
(74) *Attorney, Agent, or Firm*—Oblon, Spivak, McClelland, Maier & Neustadt, P.C.

(57) ABSTRACT

The present invention provides a ceramic circuit board comprising: a ceramic substrate comprising ceramic crystal grains and liquid phase component grains; and a conductive layer to be formed as a circuit integrally formed to the ceramic substrate, wherein the ceramic substrate has a thermal conductivity of 180 W/m·K or more and the ceramic crystal grains have an average grain size of 10 μm or less. According to the structure described above, there can be provided a ceramic circuit board which has a high thermal conductivity of 180 W/m·K or more, an excellent heat radiating property and a high strength which is capable of reducing crack formation during the assembling and operation of the circuit board, and is capable of reducing short-circuit accident to be occurred in the conductive layer.

17 Claims, 1 Drawing Sheet

CERAMIC CIRCUIT BOARD AND METHOD OF MANUFACTURING THE SAME

BACKGROUND OF THE INVENTION

1. Field of the Invention

The present invention relates to a ceramic circuit board and a method of manufacturing the same in which a conductive layer as a circuit is integrally formed to a ceramic substrate, more particularly to a ceramic circuit board and a method of manufacturing the same which can realize a ceramic circuit board having an excellent heat radiating property and a high strength which is capable of reducing crack formation during assemble and operation of the circuit board, and is capable of reducing short-circuit accident to be occurred in the conductive layer.

2. Description of the Related Art

Conventionally, as a part constituting electronic equipments and semiconductor devices, there have been widely used various ceramic circuit boards (thick-film circuit board) 1 as shown in FIGS. 1 and 2. The ceramic circuit board 1 is manufactured by integrally forming a conductive layer (metallized wiring layer) 3 as a circuit to a surface and/or an inner portion of a ceramic substrates 2 such as alumina ($Al_2O_3$) substrate, aluminum nitride (AlN) or the like.

As the ceramic substrate constituting the conventional ceramic circuit board, the alumina ($Al_2O_3$) substrate having a thermal conductivity of about 10–20 W/m·K has been widely used. Further, in case of a use where a higher heat radiating property is demanded, there has been used a structure in which heat radiating plates having various shapes and heat-sinks are combined with the circuit boards. Furthermore, there is a case where aluminum nitride (AlN) substrate having a thermal conductivity of 50–150 W/m·K is used thereby to secure a higher heat radiating property of the ceramic circuit board.

In recent years, as the progress of miniaturization and high-densification of the electronic equipments, the semiconductor parts are required to be applied with a large current for realizing a high power operation, so that there is a tendency of increasing an amount of heat to be generated from the semiconductor parts. Therefore, how to efficiently release the heat generated from the semiconductor parts has become a serious and important problem.

An aluminum nitride has excellent characteristics such as a high thermal conductivity, a good electrical insulating property and a thermal expansion coefficient which is almost the same as that of silicon (Si), so that aluminum nitride is most suitable for the substrate material for the semiconductor parts.

By the way, when the aluminum nitride (AlN) is used as a semiconductor substrate, it is necessary to form a metallized layer composed of electrically conductive metal onto a surface of the AlN substrate for the purpose of forming a circuit and a mounting portion for mounting the electronic parts or the like. As one method of metallizing, a simultaneous sintering method (co-fire method) has been utilized. In general, the metallized layer is formed on a surface of the substrate in accordance with the following procedure.

That is, a binder agent composed of organic compound is added to aluminum nitride (AlN) to prepare a slurry, then the slurry is molded by a doctor-blade method thereby to obtain an AlN green sheet having a sheet-shape. Thereafter, a refractory metal paste containing W or Mo or the like is printed onto the surface of the AlN green sheet to form a molded body. Thus obtained molded body is heated and degreased, thereafter sintered in a non-oxidative atmosphere thereby to obtain an AlN sintered body.

In addition, in recent years, a high-power operation of semiconductor device using a ceramic circuit board, a large-capacity and a high-integration of a semiconductor element have been rapidly advanced, so that there is also a tendency of rapidly increasing thermal stress and heat load to be applied to the ceramic circuit board. Therefore, the ceramic circuit board is required to have a sufficient strength and heat radiating property against the above thermal stress and heat cycles.

In order to cope with the above technical requirements, there has been also developed an aluminum nitride (AlN) substrate having a high thermal conductivity of about 180 W/m·K. This aluminum nitride (AlN) substrate is manufactured by a method comprising the steps of: adding sintering agent (sintering aid) such as yttria ($Y_2O_3$) or the like to high-purity AlN material powder to prepare a material mixture; molding the material mixture to form a molded body; and sintering and firing the molded body at a high temperature exceeding 1800° C. for a long time of about 48–72 hours so that the molded body is sintered and densified, simultaneously a liquid-phase component to become a heat resistance is discharged toward the surface of the substrate to realize a high purity of the substrate.

In the conventional ceramic circuit board using the above ceramic substrate, a high thermal conductivity could be obtained by improving a kind of the ceramic substrate or the sintering or firing methods. However, since the heat treatments (sintering and firing) for the ceramic material powder were conducted for a long time, the resultant ceramic crystal grains became coarse due to grain-growth. As a result, sufficient heat-cycle durability and bending strength could not be obtained, whereby there was posed a problem that reliability and production yield of the semiconductor device using the ceramic circuit board was disadvantageously lowered.

That is, in accordance with the progress of the high-integration and the high-power operation of the semiconductor element mounted on the ceramic circuit board, a heat-cycle load was remarkably increased. As a result, there was posed a problem that cracks would occurred at the ceramic substrate whereby a function of the circuit board was completely lost.

In addition, since the bending strength of the circuit board was small and a deflection amount thereof was also small, when the circuit board was fixed to a mounting board by means of screws at the time of assembling a semiconductor device, there was a case of that the ceramic substrate was broken by a slight fixing force of the screw, thus raising a problem of lowering a production yield of the semiconductor device using the ceramic circuit board. Furthermore, there were many cases where cracks occurred by a thermal stress to be caused during the operation of the circuit board, thus being a disadvantage of lowering the reliability of the semiconductor device.

In addition, the conventional method adopted a procedure in which the additives such as sintering agent or the like were discharged as liquid-phase component (glass component) toward a surface of the ceramic substrate or the conductive layer by firing treatment for a long time of period, thereby to improve the purity and to increase the thermal conductivity. Therefore, the liquid-phase component was non-uniformly existed on the ceramic substrate or the surface of the conductive layer, whereby there was posed a problem of exerting a bad influence on the surface treatment for the ceramic substrate. Namely, irregularities or micro-defects would occur at the surface of the ceramic substrate or the conductive layer due to the liquid-phase component. Therefore, an excessive plating component adhered to the defectives or the like remained at portions between adjacent conductive layers when the surface of the conductive layer was subjected to a plating treatment, so that there were posed problems such that short-circuits occurred, the plating layer was non-uniformly formed and a solder-wetted area was non-uniformly formed at a time of the solder-reflow operation, thus making the effect of the surface treatment insufficient.

In order to obtain an AlN substrate having a thermal conductivity of 180 W/m·K or more, it is necessary to sinter the AlN molded body at a sintering temperature exceeding 1800° C. However, when the AlN molded body is sintered at the temperature exceeding 1800° C., there has been posed a problem such that a glass component as liquid phase component contained in the AlN substrate bleeds out toward the surface portion of the AlN substrate, or the glass component would penetrate into the AlN substrate or the like.

When the glass component contained in the AlN sintered body bleeds out toward the surface portion of the AlN substrate, the bleedings become a cause of stains and discolorations to be formed at the surface of the AlN substrate. Further, when the glass component penetrates into the metallized layer or bleeds out to the surface of the metallized layer as the conductive layer, there are caused problems such that an appearance of the metallized portion becomes bad to constitute a defective and the soldering property is lowered, so that it becomes impossible to form a circuit on the metallized layer or to mount the electronic parts. That is, there has not been obtained an AlN circuit board which is manufactured by the simultaneous sintering method so as to have a thermal conductivity of 180 W/m·K or more and a metallized layer formed on a ceramic substrate.

For this reason, there has been conventionally adopted a post-fire method in which the molded body is previously sintered at a high temperature exceeding 1800° C. to prepare an AlN substrate having a thermal conductivity of 180 W/m·K or more, then the glass component bled out toward the surface of the AlN substrate is removed by grinding work or the like, thereafter, a refractory metal paste is coated onto the surface of the AlN substrate and the coated paste is baked.

In case of this post-fire method, however, since man-hour (labor cost) is greatly increased in comparison with that of the simultaneous sintering method (co-fire method) and the glass component is required to be removed by the grinding work or the like, there is posed a problem such that fine wirings cannot be formed, etc. Further, the AlN substrate is required to be formed so as to have a larger thickness containing a grinding margin, thus being troublesome and raising a problem of lowering the production efficiency.

Furthermore, other than the metallizing method using the post-fire method, there has been adopted a method in which a thin-film is formed on the surface of the substrate. Examples of the method may include a thin-film forming method by vapor deposition, a sputtering method which is one kind of vacuum evaporation methods, and CVD (chemical vapor deposition) method or the like. In these methods, however, there are posed problems such that the number of manufacturing steps is further increased in comparison with that of post-fire method, and the grinding work for the substrate surface is also required as the same as in the post-fire method.

SUMMARY OF THE INVENTION

The present invention has been achieved for solving the afore-mentioned problems, and an object of the present invention is to provide a ceramic circuit board and a method of manufacturing the same which can realize a ceramic circuit board having a high thermal conductivity, an excellent heat radiating property and a high strength, and which is capable of reducing crack formation during assemble and operation of the circuit board, and capable of reducing short-circuit accident to be occurred in the conductive layer.

Another object of the present invention is to provide a high quality aluminum nitride circuit board having a thermal conductivity of 180 W/m·K or more and an excellent heat radiating property, and which can prevent the lowering a soldering property and appearance-defectives to be caused by the bleedings formed by the glass component bleeding out on the metallized layer.

Still another object of the present invention is to provide a method of manufacturing a ceramic circuit board capable of reducing manufacturing man-hour by using a simultaneous sintering method thereby to improve the production efficiency, and capable of realizing a mass-production of the ceramic circuit board.

In order to achieve the afore-mentioned object, the inventors of the present invention had eagerly reviewed and investigated various structures of the ceramic circuit board capable of obtaining a high thermal conductivity and free from the lowering of the strength. As a result, the inventors had obtained the following findings. That is, when a molded body composed of ceramic material powder was degreased in an atmosphere comprising nitrogen gas, hydrogen gas and steam, then sintered in a reducing atmosphere for a predetermined time of period, there could be obtained a ceramic substrate of which crystal grains were fine and having both high thermal conductivity and high strength characteristic.

In addition, when a ceramic circuit board was manufactured by using the above ceramic substrate, the following findings could be obtained. Namely, it became possible at first to realize a circuit board having an excellent heat radiating property and an excellent surface characteristic, and capable of reducing the occurrence of the cracks.

Furthermore, when a thickness of the ceramic substrate was appropriately adjusted, the inventors of this invention had found that the glass component would not bleed out toward the surface of the AlN substrate and there existed a sintering condition capable of making the thermal conductivity 1800° C. or more. Namely, when the thickness of the AlN substrate exceeds 1.5 mm and if the sintering operation is not performed at a higher temperature than 1800° C., it is difficult to obtain a high thermal conductivity of 180 W/m·K or more. Moreover, when the sintering operation is performed at such high temperature, not only the glass component as the liquid phase component would move and transfer to a back surface of the AlN substrate, but also the glass component bleeds out toward the front surface of the AlN substrate whereby a high quality AlN substrate cannot be obtained.

The inventors of the present invention had found that when the thickness of AlN substrate was set to 1.5 mm or less, more preferably to 1.0 mm or less, there could be obtained an aluminum nitride substrate having a thermal conductivity of 180 W/m·K or more, more preferably 190 W/m·K or more even if the molded body is sintered at a temperature of 1800° C. or less. That is, when the thickness of AlN substrate was set to 1.5 mm or less, more preferably to 1.0 mm or less, the glass component contained in the AlN substrate moves to a back surface of the AlN substrate by the action of gravitational force, then absorbed in a setter, so that the glass component would not bleed out toward the surface of the AlN substrate whereby the problem of the appearance-defects or the like of the ceramic substrate could be eliminated. The present invention had been achieved on the basis of the findings described above.

That is, the ceramic circuit board according to the present invention is characterized by comprising: a ceramic substrate comprising ceramic crystal grains and liquid phase component grains; and a conductive layer to be formed as a circuit integrally formed to the ceramic substrate; wherein the ceramic substrate has a thermal conductivity of 180 W/m·K or more and the ceramic crystal grains have an average grain size of 10 $\mu$m or less.

Further, it is preferable that the ceramic crystal grains have an average grain size of 3–9 $\mu$m. Furthermore, the ceramic substrate is preferably composed of aluminum nitride (AlN) while the conductive layer is mainly composed of at least one refractory metal selected from the group consisting of tungsten (W) and molybdenum (Mo).

Further, it is also preferable that the conductive layer is formed by a simultaneous sintering (co-firing) method. It is also preferable that the ceramic substrate has a thickness of 1.5 mm or less.

In another aspect, it is also preferable that the liquid phase component grains existing at a surface of the ceramic substrate or a surface of the conductive layer have an average grain size of 300 $\mu$m or less. Further, in a case where the liquid phase component is a Y—Al—O type composite oxide, the thermal conductivity and strength of the circuit board can be further effectively increased.

Further, the ceramic substrate can be also formed so as to have a multi-layered structure in which a plurality of substrate elements are laminated. Furthermore, it is also preferable that the conductive layer has a thickness of 1 $\mu$m or more.

The method of manufacturing a ceramic circuit board according to the present invention is characterized by comprising the steps of: preparing a ceramic molded body composed of ceramic powder to which a sintering agent is added; coating a conductive paste onto the molded body to form a predetermined circuit pattern; heating the molded body formed with the circuit pattern in an atmosphere consisting of nitrogen gas, hydrogen gas and steam at a temperature of 600° C. or more so as to degrease the molded body and to form a degreased body; heating and sintering thus obtained degreased body at a sintering temperature of 1700° C. or more for 1 to 8 hours in a reducing atmosphere comprising of nitrogen gas so that the ceramic molded body and the conductive paste are simultaneously sintered so as to form a sintered body having a conductive layer integrally formed to the ceramic substrate; and thereafter, moderately cooling the sintered body while controlling a cooling rate to 200° C./hour or less.

In the method of manufacturing a ceramic circuit board described above, it is preferable that the sintering agent contains yttria ($Y_2O_3$) while said ceramic powder is aluminum nitride (AlN) powder.

In addition, in the method described above, it is preferable that the sintering temperature ranges from 1700° C. to 1800° C. Further, it is also preferable that the ceramic molded body coated with the conductive paste is sintered under a condition where the ceramic molded body is disposed on a setter composed of high-purity aluminum nitride. Further, it is also preferable that a thickness of the ceramic molded body is set so that the resultant ceramic sintered body will have a thickness of 1.5 mm or less. Furthermore, the ceramic substrate may be also constituted so as to have a multi-layered structure in which a plurality of substrate elements are laminated.

In this connection, when the ceramic molded body is sintered, a certain amount of contraction would be caused. Though a rate of the contraction varies in accordance with a size of the ceramic material powder, the contraction rate would be about 10–20%. Therefore, when a ceramic molded body is formed, it is preferable to set the thickness of the ceramic molded body by taking the contraction rate into consideration. In other words, if the thickness of the ceramic molded body is previously set to 1.5 mm or less, it becomes possible to surely obtain a ceramic substrate having a thickness of 1.5 mm or less.

In addition, it is also preferable that the sintering agent is added to the ceramic powder at an addition amount of 10 wt % or less.

As the ceramic substrate to be used in the ceramic circuit board of the present invention, the ceramic substrate is not particularly limited therefor. That is, other than oxide type ceramic substrates such as beryllium oxide (beryllia: BeO) or the like, there can be also used various non-oxide type ceramic substrates including nitride type ceramic substrates such as aluminum nitride (AlN), silicon nitride ($Si_3N_4$) or the like, or carbide type ceramic substrates such as silicon carbide (SiC) or the like or boride type ceramic substrates such as lanthanum boride or the like. These ceramic substrates may contain sintering agents such as yttrium oxide or the like. However, in order to attain a thermal conductivity of 180 W/m·K or more for the ceramic substrate, a ceramic substrate composed of aluminum nitride (AlN) is particularly preferable.

In the ceramic circuit boards such as aluminum nitride circuit board of this invention, a substantial thickness of the ceramic substrate except the thickness of the metallized layer is preferably set to 1.5 mm or less.

In the ceramic circuit board of this invention, the thickness of the ceramic substrate is defined as a substantial thickness. Namely, in a case where the ceramic substrate is composed of one sheet of ceramic sintered body having a single-layer structure, the thickness of the ceramic substrate means a thickness of the substrate except the metallized layer. In contrast, in a case where the ceramic substrate has a multi-layered structure in which a plurality of ceramic substrate elements are laminated, the thickness of the ceramic substrate means a total value of the respective thickness of the substrate elements except the metallized layer.

In the ceramic circuit board of this invention, it is more preferable that the substantial thickness of the ceramic substrate except the thickness of the metallized layer is set to 1.0 mm or less.

In addition, as a metal for constituting the conductive layer (metallized layer), it is preferable to use a metal mainly composed of refractory metals such as tungsten (W) and molybdenum (Mo) which can maintain a predetermined circuit pattern, even if the simultaneous sintering operation at a high temperature is conducted.

In the present invention, 20 wt % or less of powder compounds such as AlN or the like which may be the same component as the ceramic substrates such as AlN substrate may be contained in the conductive layer (metallized layer) composed of the refractory metals such as W and Mo.

In the ceramic circuit boards such as aluminum nitride circuit board of this invention, the ceramic substrate can be also formed to have a multi-layered structure in which a plurality of the above substrates are integrally laminated.

Since an average grain size of the crystal grains of the ceramic substrate has a great influence on the bending strength of the circuit board, the average grain size is set to 10 µm or less in this invention.

When the average grain size of the crystal grains becomes coarse so as to exceed 10 µm, the bending strength of the circuit board is lowered, so that cracks are liable to be occurred at the time of mounting or operating the ceramic circuit board. However, in contrast, when the average grain size of the crystal grains becomes small to be 3 µm or less, the number of grain boundary phases each having a high heat-resistance is increased, so that the thermal conductivity of the circuit board is lowered thereby to deteriorate the heat radiating property. Therefore, it is more preferable that the average grain size of the crystal grains of the ceramic substrate ranges from 3 to 9 µm.

In the ceramic circuit boards such as aluminum nitride circuit board of this invention, it is preferable that a thickness of the conductive layer (metallized layer) is 1 µm or more.

In the present invention, when the thickness of the metallized layer is set to 1 µm or more, the bleedings of the liquid phase components can be effectively prevented. The thickness of the metallized layer is preferably set to a range of 3–20 µm, more preferably to a range of 5–15 µm. When the thickness exceeds 20 µm, the metallized layer is set to 1 µm or more, the bleedings of the liquid phase components can be prevented, however, the thickness of the metallized layer becomes too thick, so that it becomes difficult to form an uniform film for circuits. In addition, an amount of the refractory metals such as W and Mo required for forming the metallized layers is increased, thus resulting in a disadvantage in view of material cost.

In another aspect of the present invention, there is provided a method of manufacturing a ceramic circuit board, the method characterized by comprising the steps of: preparing a ceramic molded body composed of ceramic powder to which a sintering agent is added; coating a conductive paste onto the molded body to form a predetermined circuit pattern; heating and degreasing the molded body; heating and sintering the molded body at a sintering temperature of 1800° C. or lower in a non-oxidizing atmosphere under a condition where a thickness of the ceramic molded body except a thickness of the conductive paste is set to 1.5 mm or less and the ceramic molded body is disposed on a setter composed of high-purity aluminum nitride.

According to the present invention, since the thickness of the ceramic substrate such as AlN substrate is set to 1.5 mm or less, the glass component contained in the AlN substrate moves to a back surface of the AlN substrate by the action of gravitational force, then absorbed in a setter, so that there can be obtained a high quality aluminum nitride substrate having a thermal conductivity of 180 W/m·K or more, if the molded body is sintered at a temperature of 1800° C. or less in accordance with a simultaneous sintering method.

In the method of manufacturing the ceramic circuit board of this invention, it is preferable to use a setter composed of high-purity aluminum nitride.

According to the present invention, when a setter composed of aluminum nitride previously purified by a high-temperature sintering is applied to the method, the glass component contained in the AlN substrate can be efficiently absorbed in the setter.

Further, in the method of manufacturing the ceramic circuit board of this invention, the ceramic substrate can be constituted by using an aluminum nitride molded body having a single-layered structure or an aluminum nitride molded body having a multi-layered structure in which a plurality of above aluminum nitride molded bodies are laminated.

Further, in the method of manufacturing the ceramic circuit board of this invention, it is preferable to add a sintering agent with respect to aluminum nitride at an amount of 10 wt % or less.

In the present invention, a reason why the addition amount of the sintering agent is set to 10 wt % or less is as follows. Namely, when the amount exceeds 10 wt %, an amount of bleedings of the liquid phase components is increased, so that there may be posed a problem such that a bonding strength of the metallized layer is disadvantageously lowered.

In addition, in one aspect of the present invention, a setter composed of high-purity aluminum nitride (AlN) is used. For example, the above setter is manufactured in such a manner that AlN material containing about 3 wt % of yttrium oxide ($Y_2O_3$) is sintered at a predetermined temperature thereby to bleed out the liquid phase component (glass component), then the resultant AlN sintered body is continued to be heated and the sintering temperature is retained till a state where the liquid phase component would bleed no more.

Thus manufactured setter composed of the AlN sintered body substantially contains no liquid phase component, and the AlN substrate attains to a high-purity state with a purity of 97–100%. When such a high-purity AlN setter is used, the liquid phase component bled out from the AlN substrate (sintered body) is effectively absorbed by the setter, so that the simultaneous-sintered metallized substrate having less defectives can be produced with a high production efficiency.

In a case where the ceramic substrate is AlN substrate, the ceramic circuit board according to the present invention is manufactured in accordance with the following concrete procedure. That is, a fine AlN powder having an average grain size of 1.5 µm or less and containing 1 wt % or less of oxygen or the like as impurities. is prepared. Then, 3–6 wt % of yttria ($Y_2O_3$) as a sintering agent is added to the AlN powder to form a mixture. Subsequently, the mixture is uniformly mixed by means of a ball-mill or the like to prepare a material mixture.

Thereafter, 4–6 wt % of polyvinyl alcohol (PVA) or the like as a binder is added to the material mixture to prepare granulated or pelletized powders. Subsequently, the granulated powder is compressively molded by means of a press-molding machine to form a molded body. In another way, a solvent is added to the material mixture to prepare a slurry. Then, the slurry is treated in accordance with sheet-molding methods such as Doctor-blade method thereby to prepare a sheet-shaped molded body.

Next, a conductive paste containing at least one of W and Mo as a main ingredient is coated onto a surf ace of thus obtained molded body by a screen-printing method or the like thereby to form circuit patterns. Thereafter, the molded body is subjected to a degreasing treatment such that the molded body is heated to a temperature of 600° C. or higher for 1–2 hours in an atmosphere consisting of nitrogen gas, hydrogen gas and steam. This degreasing atmosphere may preferably be an atmosphere containing 50 vol. % or more of nitrogen. Further, it is also preferable that an amount of hydrogen gas is set to larger than the steam amount in terms of volumetric ratio. When the amount of the steam is larger than the amount of hydrogen gas, the atmosphere comes to substantially exhibit an oxidizing property, thus being not preferable. Furthermore, the degreasing temperature may preferably be set to a range of 600 to 900° C.

Then, the molded body subjected to the degreasing treatment is accommodated in a sintering container composed of AlN, subsequently subjected to a densifying-sintering treatment at a temperature of 1700–1800° C. for 1–6 hours in a reducible atmosphere containing nitrogen gas into which hydrogen or the like is mixed, thereafter the resultant sintered body is moderately cooled at a cooling speed of 200° C./hour or less thereby to finally manufacture the ceramic circuit board.

When the above degreasing treatment, sintering treatment and the moderately-cooling treatment after the sintering are conducted, the size of the liquid phase component grains existing on the surfaces of the ceramic substrate and the conductive layer can be reduced to be fine.

That is, when the degreasing operation in the atmosphere consisting of nitrogen gas, hydrogen gas and steam is combined with the moderately-cooling operation after the sintering operation, there can be obtained a ceramic circuit board which has a thermal conductivity of 180 W/m·K or more and contains ceramic crystal grains having an average grain size (diameter) of 10 $\mu$m or less. In addition, the three-point bending strength of the ceramic circuit board can be also increased to 350 MPa or more, more preferably to 400 MPa or more.

Further, when the AlN setter having a high purity is used while the thickness of the AlN substrate is set to 1.5 mm or less, the size of the liquid phase component grains existing on the ceramic substrate and the conductive layer can be reduced to be fine, and finally, it becomes also possible to completely eliminate the liquid phase component to become substantially zero.

In particular, since a maximum grain size of the above liquid-phase component grains exerts a great influence on the surface treatments such as plating treatment for the conductive layer which is conducted at subsequent process, the above maximum grain size of the liquid-phase component grains is set to 300 $\mu$m or less in the present invention. When the maximum grain size becomes coarse so as to exceed 300 $\mu$m, the irregularities or defectives are liable to occur on the surface of the ceramic substrate or conductive layer by the action of the liquid phase components, and plating components adhered to the defectives or the like remain at portions between the adjacent conductive layers. As a result, there is liable to cause disadvantages such that short-circuit accidents will occur, blisters of plated layers will occur, and solder-wettability becomes non-uniform. Therefore, the maximum grain size of the above liquid-phase component grains is set to 300 $\mu$m or less, preferably to a range of 250 $\mu$m or less, more preferably to a range of 100 $\mu$m or less. In particular, a range of fine grains of 40 $\mu$m or less is preferable.

Further, in a case where the liquid phase component is Y—Al—O type composite oxide, a size-reduction of the liquid phase component grains contained in the ceramic substrate can be effectively attained. In particular, in a case where aluminum nitride (AlN) powder is used as the material for constituting the ceramic substrate while yttrium type sintering assistants such as $Y_2O_3$ is used as the sintering agent, Y—Al—O type composite oxides such as $Y_3Al_5O_{12}$, $YAlO_3$, $Y_4Al_2O_9$, $Y_2O_3$ or the like are generated as the liquid phase components at the time of sintering operation, so that a highly-purification of AlN crystal grains and a densifying-sintering of the AlN component are effectively advanced. At the same time, these composite oxides move to the surface portions of ceramic substrate and conductive layers, so that the ceramic substrate is promoted to be highly purified and thermal conductivity of the ceramic substrate is increased to be high.

On the other hand, the composite oxides moved to the surface portions of ceramic substrate and conductive layers are dispersed as fine grains, so that the irregularities or defectives are hardly formed. Therefore, there is few case where such defectives exert a bad influence on a plating treatment or the like to be performed in the subsequent process.

According to the ceramic circuit board and the method of manufacturing the same as constructed above, since the ceramic substrate has a thermal conductivity of 180 W/m·K or more and is excellent in heat radiating property, a temperature rise at time of operating the semiconductor element can be effectively suppressed in comparison with that of the conventional ceramic circuit board. In addition, it becomes possible to mount a semiconductor element having a higher output power, so that it becomes also possible to sufficiently cope with high-power operation and high integration of the semiconductor element.

Further, since the average grain size of the crystal grains constituting the ceramic substrate is set to 10 $\mu$m or less, a bending strength of the whole ceramic circuit board can be sufficiently secured. As a result, the cracks are hardly occurred even at the time of assembling and operating the ceramic circuit board.

Furthermore, since the average grain size of the liquid phase component grains existing on the surfaces of the ceramic substrate and the conductive layers is set to 300 $\mu$m or less, the generation of the irregularities or defectives due to the liquid phase component grains can be reduced, so that there can be realized advantages such that a generation rate of the short-circuit accident of the conductive layer due to the plating component adhered to the defectives can be greatly lowered, and it becomes possible to make the effects of the surface treatments such as plating treatment and a solder-reflow treatment or the like uniform, thereby to realize a more stable surface treatment.

DESCRIPTION OF THE PREFERRED EMBODIMENTS

Next, the preferred embodiments of the present invention will be explained hereunder on the basis of the following examples with reference to the accompanying drawings.

EXAMPLES 1–10

5 wt % of yttrium ($Y_2O_3$) as sintering agent and 5.5 wt % of polyvinyl alcohol (PVA) as an organic solvent were added to aluminum nitride (AlN) powder containing 0.8 wt % of oxygen as impurity and having an average grain size of 1 $\mu$m thereby to form a mixture. Then, ethyl alcohol as the solvent was added to the mixture and uniformly mixed thereby to prepare a material mixture in a slurry state. Thereafter, the material mixture in a slurry state was molded in accordance with a Doctor-blade method thereby to prepare a number of AlN green sheets each having a sheet-shape.

Figure 1:
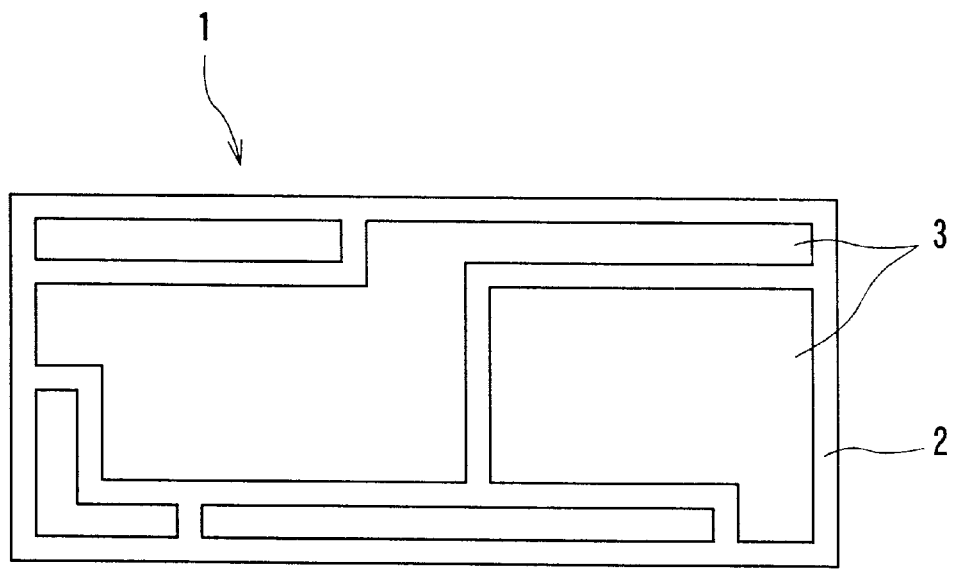
FIG. 1 is a plan view schematically showing one embodiment of a ceramic circuit board according to the present invention.

On the other hand, additives, an organic binder and an organic solvent were added to tungsten (W) powder thereby to prepare a conductive paste. Then, the conductive paste was printed and coated onto both front and rear surfaces of the AlN green sheet by utilizing thick-film method such as screen-printing method thereby to form conductive patterns having a predetermined shape as shown in FIG. 1. Thereafter, each of thus obtained AlN green sheet was subjected to a cutting-work to form a sheet-shaped molded body having a size of 100 mm×100 mm×1 mm$^t$.

Then, each of the sheet-shaped AlN molded bodies with the printed conductive patterns was heated and subjected to a degreasing (de-binder) treatment in the atmospheres consisting of nitrogen, hydrogen and steam for two hours as shown in Table 1. Subsequently, the degreased AlN molded bodies were disposed on a setter composed of boron nitride (BN) and fired in a reducible atmosphere containing nitrogen gas for a predetermined time shown in Table 1. Thereafter, the resultant fired bodies were moderately cooled at a predetermined cooling speed shown in Table 1, thereby to manufacture a number of ceramic circuit boards (thick-film circuit boards) according to Examples 1–10 having W-conductive layers as the circuits integrally formed to the surfaces of the AlN substrate.

COMPARATIVE EXAMPLES (C.Examples) 1–6

The same manufacturing process as in Example 1 was repeated except that the molded bodies were treated under the degreasing conditions and the sintering conditions shown in Table 1, thereby to manufacture the respective ceramic circuit boards according to Comparative Examples 1–6 having the same size as that of Example 1.

Figure 2:
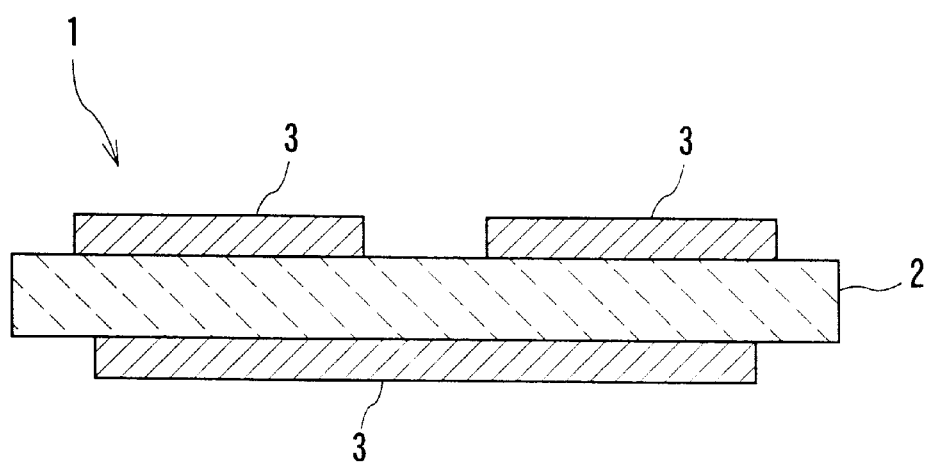
FIG. 2 is a cross sectional view of the ceramic circuit board shown in FIG. 1.

Thus manufactured ceramic circuit boards 1 of according to the respective Examples and Comparative Examples has a structure in which W-conductive layers 3 and 3 are integrally formed onto the front and back surfaces of the AlN substrate as the ceramic substrate as shown in FIGS. 1 and 2.

With respect to the ceramic circuit boards according to the respective Examples and Comparative Examples, a thermal conductivity and an average grain size of the crystal grains of the AlN substrate constituting the ceramic circuit board and a maximum grain size of the liquid phase component grains existing on the surfaces of the substrate and the conductive layers and a three-point bending strength of the circuit board were measured thereby to obtain the results shown in Table 1.

Note, when the three-point bending strength was measured, a test piece having a size of 3 mm×4 mm×30 mm was used for measuring a transverse rupture strength. The test piece was prepared by a method comprising the steps of: laminating green sheets to form a sample having a thickness of 4 mm; sintering the sample to form a sintered body; and working the sintered body so as to have the above size. As the method of measuring the three-point bending strength, a method prescribed in JIS (Japanese Industrial Standard) was adopted.

In addition, the maximum grain size of the liquid phase component grains is defined as follows. That is, with respect to arbitrary three portions each having an unit area corresponding to 100 μm×100 μm on the ceramic substrate or conductive layer, enlarged photo-pictures with a magnification of at least 20 times are taken by means of microscope or the like. Then, among the liquid phase oxide grains taken in the enlarged photo-pictures and each having a diagonal line to be drawn in the respective images of oxide grains, a length of the longest diagonal line was defined as the maximum grain size of the liquid phase component grains.

Furthermore, the surfaces of the conductive layers of the respective ceramic circuit boards were formed with electrolytic nickel plating layers each having a thickness of 3 μm, then washed and dried. At this state, the absence or presence of the short-circuit accident in the conductive layer due to a remaining plate-component was confirmed. That is, the absence or presence of the short-circuit accident was confirmed by such a manner that each of the circuit boards of Examples and Comparative Examples were manufactured to an amount of 100 respectively, and the absence (No) or presence (Yes) of the short-circuit accident was confirmed. The measuring results are shown in the following Table 1. In Table 1, C.Example denotes a Comparative Example.

TABLE 1

| Sample No. | Degreasing Conditions Atmosphere Composition (vol. %) | Temperature (° C.) | Sintering Conditions Atmosphere | Sintering Conditions Temp. × Time (° C.) × (Hr) | Cooling Rate (° C./Hr) | Thermal Conductivity (W/m · K) | Average Diameter of Ceramic Crystal Grains (μm) | Maximum Grain Size of Liquid-Phase Component Grains (μm) Surface of Substrate | Maximum Grain Size of Liquid-Phase Component Grains (μm) Surface of Conductive Layer | Three-Point Bending Strength (MPa) | Presence or Absence of Short-Circuit Accident |
|---|---|---|---|---|---|---|---|---|---|---|---|
| Example 1 | 65N$_2$—30H$_2$—5H$_2$O | 600 | N$_2$ | 1800 × 4 | 150 | 180 | 4 | 18 | 10 | 400 | None |
| Example 2 | 65N$_2$—30H$_2$—5H$_2$O | 900 | N$_2$ | 1800 × 5 | 150 | 190 | 5 | 20 | 10 | 420 | None |
| Example 3 | 65N$_2$—30H$_2$—5H$_2$O | 900 | N$_2$ | 1800 × 7 | 100 | 198 | 6 | 30 | 30 | 410 | None |
| Example 4 | 65N$_2$—30H$_2$—5H$_2$O | 850 | N$_2$ | 1800 × 7 | 100 | 203 | 6 | 40 | 40 | 410 | None |
| Example 5 | 65N$_2$—30H$_2$—5H$_2$O | 850 | N$_2$ | 1800 × 7 | 50 | 206 | 6.5 | 40 | 40 | 400 | None |
| Example 6 | 67N$_2$—30H$_2$—3H$_2$O | 900 | N$_2$ | 1800 × 7 | 100 | 201 | 6 | 40 | 40 | 410 | None |

TABLE 1-continued

| | Degreasing Conditions | | | Sintering Conditions | | Cooling Rate (°C./Hr) | Thermal Conductivity (W/m·K) | Average Diameter of Ceramic Crystal Grains (μm) | Maximum Grain Size of Liquid-Phase Component Grains (μm) | | Three-Point Bending Strength (MPa) | Presence or Absence of Short-Circuit Accident |
|---|---|---|---|---|---|---|---|---|---|---|---|---|
| Sample No. | Atmosphere Composition (vol. %) | Temperature (°C.) | Atmosphere | Temp. × Time (°C.) × (Hr) | | | | | Surface of Substrate | Surface of Conductive Layer | | |
| Example 7 | 67N₂—30H₂—3H₂O | 800 | N₂ | 1800 × 7 | | 200 | 195 | 10 | 100 | 100 | 405 | None |
| Example 8 | 67N₂—30H₂—3H₂O | 900 | N₂ | 1850 × 7 | | 150 | 200 | 10 | 250 | 250 | 410 | None |
| Example 9 | 67N₂—30H₂—3H₂O | 900 | N₂ | 1850 × 8 | | 200 | 202 | 10 | 300 | 300 | 400 | None |
| Example 10 | 67N₂—30H₂—3H₂O | 900 | N₂ | 1750 × 8 | | 190 | 205 | 10 | 290 | 280 | 410 | None |
| C. Example 1 | 60N₂—10H₂—30H₂O | 900 | N₂ | 1800 × 5 | | 150 | 170 | 3 | 20 | 10 | 430 | None |
| C. Example 2 | 65N₂—30H₂—5H₂O | 950 | N₂ | 1800 × 5 | | 150 | 173 | 5 | 20 | 20 | 420 | None |
| C. Example 3 | 65N₂—30H₂—5H₂O | 900 | N₂ | 1800 × 5 | | 250 | 172 | 4 | 20 | 20 | 430 | None |
| C. Example 4 | 65N₂—30H₂—5H₂O | 900 | N₂ | 1800 × 10 | | 150 | 194 | 11 | 350 | 70 | 350 | Yes |
| C. Example 5 | 65N₂—30H₂—5H₂O | 950 | N₂ | 1800 × 10 | | 250 | 196 | 12 | 420 | 80 | 340 | Yes |
| C. Example 6 | 65N₂—30H₂—5H₂O | 900 | N₂ | 1850 × 5 | | 150 | 198 | 8 | 450 | 150 | 380 | Yes |

As is clear from the results shown in Table 1, according to the ceramic circuit boards of the respective Examples in which the average grain sizes of the crystal grains of the AlN substrates were set to 10 μm or less, it was confirmed that the circuit boards had high three-point bending strengths of 350 MPa or more, preferably 400 MPa or more, while maintaining high thermal conductivities of 180 W/m·K or more, and the occurrence of cracks during the assembling and operating the circuit boards was found to be reduced.

Further, in case of the ceramic circuit boards of the respective Examples in which the average grain size of the liquid phase component grains existing on the surfaces of the ceramic substrate and the conductive layers is set to 300 μm or less, the generation of the irregularities or defectives are hardly formed on the surfaces of the ceramic substrates and the conductive layers, so that it was confirmed that the short-circuit accident to be caused by the plating components remained at the defectives can be greatly lowered.

In particular, according to the ceramic circuit boards of the respective Examples in which the average grain size of the liquid phase component grains existing on the surface of the conductive layers is controlled to be 300 μm or less, it was also confirmed that non-uniformity of the plating layer due to the liquid phase components can be eliminated. In addition, the solder-wettability of the surface of the conductive layer became uniform and satisfactory, so that it became also possible to make the effects of the surface treatments such as the plating treatment and the solder-reflow treatment or the like uniform. In addition, blister-defects of the plated layers to be caused by residual plating solution could be eliminated.

As described above, the ceramic circuit boards of the respective Examples are formed to have a high strength while having a high thermal conductivity, so that the circuit board can efficiently release and radiate the heat generated from the semiconductor element mounted on the circuit board. Therefore, it becomes possible to mount a semiconductor element having a higher output power.

On the other hand, the ceramic circuit boards of the respective Comparative Examples have a high strength while the thermal conductivity is excessively small, so that the circuit boards cannot exhibit a good heat-radiating property. Further, in cases of Comparative Example 4 or 5, since the sintering operation was performed for a long time for the purpose of increasing the thermal conductivity, AlN crystal grains were grown to be coarse and a sufficient strength could not be obtained. Therefore, it was also confirmed that a durability or resistance of the circuit board against the cracks was low.

Next, the preferred embodiments of the present invention in which a high purity setter is used in the manufacturing process will be explained hereunder on the basis of the following Examples and Comparative Examples.

EXAMPLES 11–21

In these Examples, as shown in Table 2, AlN substrates each having a substantial thickness of 1.5 mm or less were used as aluminum nitride (AlN) substrates. The AlN substrate for Example 11 was prepared in accordance with the following procedure.

At first, a material powder was prepared by adding 5 wt % of yttrium oxide ($Y_2O_3$) powder as a sintering agent to aluminum nitride (AlN) powder having an average grain size of 1.5 μm, then the material powder was pulverized and mixed by means of a ball mill. Then, an organic binder and an organic solvent were added to the material mixture, thereafter mixed thereby to prepare a slurry. Subsequently, the slurry was molded into a sheet-shaped molded body by a Doctor-blade method to prepare AlN green sheets having a substantial thickness of 1.5 mm.

On the other hand, an appropriate amount of resin binder and dispersant were added to tungsten (W) powder having an average grain size of 1 μm to prepare a W-paste for forming a metallized layer.

Then, the W-paste was screen-printed onto the AlN green sheets, and dried. The AlN green sheets coated with the W-paste were subjected to a degreasing treatment at a temperature of 900° C. in a nitrogen atmosphere for three hours.

On the other hand, a setter composed of AlN sintered body containing 3 wt % of yttrium oxide ($Y_2O_3$) was sintered at a high temperature of 1900° C. so that a liquid phase components were bled out thereby to prepare a high purity setter.

The AlN green sheets subjected to the degreasing treatment were disposed on the high purity setter, and sintered at a temperature of 1800° C. in a nitrogen atmosphere for six hours so that AlN substrate and W layers were simultaneously fired (sintered) thereby to manufacture an AlN substrate composed of a single-layer. This AlN substrate with conductive layers was prepared as a ceramic circuit board of Example 11.

The AlN substrates for Examples 12–18 are the AlN substrates that were manufactured by almost the same procedure as in Example 11. As shown in Table 2, Example 12 adopted an AlN substrate having a thickness of 1.5 mm, and W and AlN were used as components for forming the metallized layer. In addition, the AlN substrates used in Examples 13–17 utilized single-layered AlN substrates of which thickness was gradually reduced by 0.2 mm from a maximum thickness of 1.4 mm.

Example 18 uses an AlN substrate having a multi-layered structure which is formed by: coating W-paste onto the AlN green sheets each having a thickness of 0.4 mm; laminating two sheets of the AlN green sheets to form a laminated body, and sintering the laminated body. In Examples 19–21, the thickness of the metallized layers were changed. Note, in each of the cases where AlN was added to the metallized layers, an addition amount of AlN was set to 3 wt %, respectively. In Examples 11–21, a substantial thickness of AlN substrate excluding a thickness of the metallized layer was set to 1.5 mm or less, and the sintering temperature was set to 1800° C. or lower.

COMPARATIVE EXAMPLES 7–8

In these Comparative Examples, the aluminum nitride (AlN) substrates each having a substantial thickness exceeding 1.5 mm were used. Note, the preparing procedure of the AlN substrates was the same as that in Example 11.

As shown in Table 2, Comparative Example 7 used a single-layered AlN substrate, while Comparative Example 8 used a multi-layered AlN substrate having a substantial thickness of 1.6 mm which was manufactured by: laminating four sheets of AlN green sheets each having a thickness of 0.5 mm to form a laminated body; thereafter sintering the laminated body. Note, the components and thickness of the metallized layers and the sintering conditions are shown in Table 2.

COMPARATIVE EXAMPLE 9

In this Comparative Example 9, a conventional setter composed of boron nitride (BN) was used at the time of the sintering operation, and a single-layered AlN substrate having a thickness of 1.5 mm was used. Note, the preparing procedure of the AlN substrate was the same as that in Example 11, and the components and thickness of the metallized layer and the sintering conditions are shown in Table 2.

COMPARATIVE EXAMPLE 10

In this Comparative Example 10, a conventional multi-layered AlN substrate was used and the substrate was manufactured by: laminating eight sheets of AlN green sheets each having a thickness of 0.4 mm to form a laminated body; thereafter sintering the laminated body. Note, the preparing procedure of the AlN substrate was the same as that in Example 11, and the components and thickness of the metallized layer and the sintering conditions are shown in Table 2.

With respect to thus manufactured ceramic circuit boards of the respective Examples and Comparative Examples, appearances of AlN substrates were observed for evaluating characteristics of the circuit boards. As a method of evaluating the characteristics by the appearance observation, the following procedure was adopted. Namely, the surface of the metallized layer was observed by means of a microscope with a magnification of 20 times, The appearance was measured on the basis of whether bleedings of the liquid phase was observed or not.

Concretely to say, when the average grain size of the liquid phase component grains to be confirmed by the observation through an enlarged image with a magnification of 20 times taken by the microscope exceeds 300 µm, the appearance was evaluated to be "no-good", while when the average grain size of the liquid phase component grains was 300 µm or less, the appearance was evaluated to be "good".

In addition, with respect to each of the AlN substrates, a thermal conductivity was measured. Note, the thermal conductivity was measured by a laser-flash method. The results are shown in the following Table 2.

TABLE 2

| Sample No. | AlN Substrate | | Metallized Layer | | Sintering Conditions | | | Thermal | |
| | Thickness (mm) | Structure | Component | Thickness (µm) | Temperature (° C.) | Time (h) | Kind of Setter | Conductivity (W/m · K) | Appearance |
| --- | --- | --- | --- | --- | --- | --- | --- | --- | --- |
| Example 11 | 1.5 | Single Layer | W | 10 | 1800 | 6 | High-Purity AlN | 195 | Good |
| Example 12 | 1.5 | Single Layer | W + AlN | 10 | 1800 | 6 | High-Purity AlN | 195 | Good |
| Example 13 | 1.4 | Single Layer | Mo | 10 | 1800 | 6 | High-Purity AlN | 195 | Good |
| Example 14 | 1.2 | Single Layer | Mo + AlN | 10 | 1800 | 6 | High-Purity AlN | 195 | Good |
| Example 15 | 1.0 | Single Layer | W | 10 | 1800 | 6 | High-Purity AlN | 195 | Good |
| Example 16 | 0.8 | Single Layer | Mo | 10 | 1800 | 6 | High-Purity AlN | 195 | Good |
| Example 17 | 0.6 | Single Layer | W | 10 | 1800 | 6 | High-Purity AlN | 195 | Good |
| Example 18 | 0.4 × 2 | Multi-Layers (Two-Layered) | W | 10 | 1800 | 6 | High-Purity AlN | 190 | Good |
| Example 19 | 1.0 | Single Layer | W | 5 | 1800 | 6 | High-Purity AlN | 195 | Good |
| Example 20 | 1.0 | Single Layer | W | 1 | 1800 | 6 | High-Purity AlN | 195 | Somewhat Good |

TABLE 2-continued

| Sample No. | AlN Substrate Thickness (mm) | Structure | Metallized Layer Component | Thickness (μm) | Sintering Conditions Temperature (° C.) | Time (h) | Kind of Setter | Thermal Conductivity (W/m · K) | Appearance |
|---|---|---|---|---|---|---|---|---|---|
| Example 21 | 1.0 | Single Layer | Mo + AlN | 1 | 1800 | 6 | High-Purity AlN | 195 | Good |
| C. Example 7 | 2.0 | Single Layer | W | 10 | 1800 | 6 | High-Purity AlN | 185 | No-Good |
| C. Example 8 | 0.4 × 4 | Multi-Layers (Four-Layered) | W | 10 | 1800 | 6 | High-Purity AlN | 190 | No-Good |
| C. Example 9 | 1.5 | Single Layer | W | 10 | 1800 | 6 | BN | 180 | No-Good |
| C. Example 10 | 0.4 × 8 | Multi-Layers (Eight-layered) | W | 10 | 1800 | 6 | High-Purity AlN | 170 | No-Good |

As is clear from the results shown in Table 2, in the AlN substrates used in the ceramic circuit boards according to Comparative Examples 7 to 10, defectives such as stains and discoloration or the like were observed, the appearances of the AlN substrates were not good, and the thermal conductivities were 190 W/m·K or less.

On the other hand, the AlN substrates used in Examples 11–18 had occurred neither stain nor discoloring, so that the appearances of the AlN substrates were good. Further, each of the AlN substrates had a high thermal conductivity of 190 W/m·K or more, so that there could be obtained a high quality AlN circuit board excellent in heat radiating property. This is because that the liquid phase components generated from the AlN substrate were absorbed by the high-purity AlN setters.

Further, in case of Example 20 formed with a metallized layer having a thickness of 1 μm, a small amount of bleeding of the liquid phase components was started to be observed, so that it was confirmed that the thickness of the metallized layer was preferably set to 1 μm or more. On the other hand, in case of Example 21 in which AlN was added into the metallized layer, the bleeding was not observed at all. In view of this fact, it was also confirmed that the addition of AlN into the metallized layer had an effect of preventing the bleedings of the liquid phase components.

According to the respective Examples of this invention, since the thickness of the AlN substrate was set to 1.5 mm or less, there can be provided an AlN substrate having a thermal conductivity of 180 W/m·K or more, preferably 190 W/m·K or more by the simultaneous-sintering (co-fire) method even if the sintering temperature was 1800° C. or lower. Accordingly, since the simultaneous sintering method is used in these Examples, a man-hour for manufacturing the circuit board can be reduced and a production efficiency is improved thereby to enable the AlN circuit board to be mass-produced.

In addition, the AlN circuit board manufactured by the method of this invention has a thermal conductivity of 180 W/m·K or more and an excellence in heat radiating property, so that the circuit board can be used as a mounting board for mounting a semiconductor element with high-powered specification, whereby the miniaturization and high-densification of the electronic devices can be further advanced.

By the way, even in a case where the ceramic substrate is formed to have a multi-layered structure as like Examples, the AlN substrate has an excellent heat radiating property. Therefore, even if the semiconductor parts are formed to have a high-integration and high-density, the miniaturization and highly densification of the electronic devices can be realized.

Next, the preferred embodiments of the ceramic circuit boards according to the present invention in which the molded bodies were degreased in an atmosphere consisting of nitrogen, hydrogen and steam and a high purity AlN setter was used in the manufacturing process will be explained hereunder on the basis of the following Examples.

EXAMPLES 22–24

The ceramic circuit boards of Examples 22–24 were manufactured in accordance with substantially the same manufacturing methods and conditions as used in Examples 2, 4 and 7 except that the setter was changed to a high-purity AlN setter. With respect to thus manufactured ceramic circuit boards, characteristics were measured and evaluated in the same manner as in Examples. The results are shown in the following Table 3.

TABLE 3

| Sample No. | Average Diameter of Ceramic Crystal Grains (μm) | Maximum Grain Size of Liquid-Phase Component Grain existing on Surface of Substrate (μm) | Maximum Grain Size of Liquid-Phase Component Grains (μm) | Three-Point Bending Strength (MPa) | Presence or Absence of Short-Circuit Accident |
|---|---|---|---|---|---|
| Example 22 | 5 | 10 | 2 | 430 | No |
| Example 23 | 5.5 | 20 | 5 | 440 | No |
| Example 24 | 9 | 60 | 40 | 420 | No |

As is clear from the results shown in Table 3, when the degreasing operation in which ceramic molded bodies are degreased in an atmosphere consisting of nitrogen, hydrogen and steam was combined with the sintering treatment in which the ceramic molded bodies disposed on the high-purity AlN setter are sintered, it was confirmed that the size of the liquid phase component grains to be formed on the surfaces of the ceramic substrate and the conductive layer can be further reduced to be fine.

According to Examples, there could be obtained an aluminum nitride substrate which was excellent in heat radiating property so as to have a high thermal conductivity of 180

W/m·K or more and preferably 190 W/m·K or more and high quality. At the same time, since the metallized layers were formed in accordance with the simultaneous sintering method (Co-fire method), there could be provided the method of manufacturing the ceramic circuit board capable of mass-producing the ceramic circuit board with a high production efficiency.

As described above, according to the ceramic circuit board and the method of manufacturing the same of the present invention, since the ceramic substrate has a thermal conductivity of 180 W/m·K or more and is excellent in heat radiating property, a temperature-rise at the time of operating the semiconductor element mounted on the ceramic circuit board can be effectively suppressed in comparison with that of the conventional ceramic circuit board. In addition, it becomes also possible to mount a semiconductor element having a higher output power, so that it becomes also possible to sufficiently cope with high-power operation and high integration of the semiconductor element.

Further, since the average grain size of the crystal grains constituting the ceramic substrate is set to 10 μm or less, a bending strength of the whole ceramic circuit board can be sufficiently secured. As a result, the cracks are hardly occurred even at the time of assembling and operating the ceramic circuit board.

Furthermore, since the average grain size of the liquid phase component grains existing on the surfaces of the ceramic substrate and the conductive layers is set to 300 μm or less, the generation of the irregularities or defectives due to the liquid phase component grains can be reduced, so that there can be realized advantages such that a generation rate of the short-circuit accident of the conductive layer due to the plating component adhered to the defectives can be greatly lowered, and it becomes possible to make the effects of the surface treatments such as plating treatment and a solder-reflow treatment or the like uniform, thereby to realize a more stable surface treatment.

What is claimed is:

1. A ceramic circuit board comprising:
    a ceramic substrate comprising ceramic crystal grains and liquid phase component grains; and
    a conductive layer to be formed as a circuit integrally formed to said ceramic substrate;
    wherein said ceramic substrate has a thermal conductivity of 180 W/m·K or more and said ceramic crystal grains have an average grain size of 10 μm or less, said ceramic substrate being mainly composed of aluminum nitride while said conductive layer being mainly composed of at least one refractory metal selected from the group consisting of tungsten and molybdenum, and said liquid phase component grains existing at a surface of said ceramic substrate having an average grain size of 300 μm or less.

2. A ceramic circuit board according to claim 1, wherein said ceramic crystal, grains have an average grain size of 3–9 μm.

3. A ceramic circuit board according to claim 1, wherein said conductive layer is formed by a simultaneous co-firing method.

4. A ceramic circuit board according to claim 1, wherein said ceramic substrate has a thickness of 1.5 mm or less.

5. A ceramic circuit board according to claim 1, wherein said liquid phase component grains existing at a surface of said conductive layer have a maximum grain size of 300 μm or less.

6. A ceramic circuit board according to claim 1, wherein said liquid phase component is a Y—Al—O type composite oxide.

7. A ceramic circuit board according to claim 1, wherein said ceramic substrate has a multi-layered structure in which a plurality of substrate elements are laminated.

8. A ceramic circuit board according to claim 1, wherein said conductive layer has a thickness of 1 μm or more.

9. A ceramic circuit board according to claim 1, wherein said ceramic circuit board having the conductive layer has a three-point bending strength of 350 MPa or more.

10. A method of manufacturing a ceramic circuit board, the method comprising the steps of:
    preparing a ceramic molded body composed of ceramic powder to which a sintering agent is added;
    coating a conductive paste onto said molded body to form a predetermined circuit pattern;
    heating said molded body formed with the circuit pattern in an atmosphere consisting of nitrogen gas, hydrogen gas and steam at a temperature of 600° C. or more so as to degrease the molded body and to form a degreased body;
    heating and sintering thus obtained degreased body at a sintering temperature of 1700° C. or more for 1 to 8 hours in a reducible atmosphere comprising of nitrogen gas so that said ceramic molded body and said conductive paste are simultaneously sintered so as to form a sintered body having a conductive layer integrally formed to said ceramic substrate; and
    thereafter, moderately cooling the sintered body while controlling a cooling rate to 200° C./hour or less,
    thereby obtaining a ceramic circuit board comprising:
        a ceramic substrate comprising ceramic crystal gains and liquid phase component grains; and
        a conductive layer to be formed as a circuit intergrally formed to said ceramic substrate;
        wherein said ceramic substrate has a thermal conductivity of 180 W/m·K or more and said ceramic crystal grains have an average size of 10 μm or less, said ceramic substrate being mainly composed of aluminum nitride while said conductive layer being mainly composed of at least one refractory metal selected from the group consisting of tungsten and molybdenum, and said liquid phase component grains existing at a surface of said ceramic substrate having an average grain size of 300 μm or less.

11. A method of manufacturing a ceramic circuit board according to claim 10, wherein said sintering agent contains yttria ($Y_2O_3$) while said ceramic powder is aluminum nitride (AlN) powder.

12. A method of manufacturing a ceramic circuit board according to claim 10, wherein said sintering temperature ranges from 1700° C. to 1800° C.

13. A method of manufacturing a ceramic circuit board according to claim 10, wherein said ceramic molded body coated with the conductive paste is sintered under a condition where the ceramic molded body is disposed on a setter composed of high-purity aluminum nitride.

14. A method of manufacturing a ceramic circuit board according to claim 10, wherein said ceramic molded body has a thickness of 1.5 mm or less.

15. A method of manufacturing a ceramic circuit board according to claim 10, wherein said ceramic substrate has a multi-layered structure in which a plurality of substrate elements are laminated.

16. A method of manufacturing a ceramic circuit board according to claim 10, wherein said sintering agent is added to the ceramic powder at an addition amount of 10 wt % or less.

17. A method of manufacturing a ceramic circuit board, the method comprising the steps of:

preparing a ceramic molded body composed of ceramic powder to which a sintering agent is added;

coating a conductive paste onto said molded body to form a predetermined circuit pattern;

heating and degreasing the molded body, heating and sintering the molded body at a sintering temperature of 1800° C. or lower in a non-oxidizing atmosphere under a condition where a thickness of said ceramic molded body except the conductive paste is set to 1.5 mm or less and said ceramic molded body is disposed on a setter composed of high-purity aluminum nitride, thereby obtaining a ceramic circuit board comprising:
  a ceramic substrate comprising ceramic crystal grains and liquid phase component grains; and
  a conductive layer to be formed as a circuit integrally formed to said ceramic substrate;
wherein said ceramic substrate has a thermal conductivity of 180 W/m·K or more and said ceramic crystal grains have an average grain size of 10 $\mu$m or less, said ceramic substrate being mainly composed of aluminum while said conductive layer being mainly composed of at least one refractory metal selected from the group consisting of tungsten and molybdenum, and said liquid phase component grains existing at a surface of said ceramic substrate having an average grain size of 300 $\mu$m or less.

* * * * *